(12) United States Patent
Schmieder et al.

(10) Patent No.: US 9,091,237 B2
(45) Date of Patent: Jul. 28, 2015

(54) INJECTOR FOR A FLUID

(75) Inventors: Dietmar Schmieder, Markgroeningen (DE); Andreas Jakobi, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 322 days.

(21) Appl. No.: 13/519,128

(22) PCT Filed: Nov. 4, 2010

(86) PCT No.: PCT/EP2010/066790
§ 371 (c)(1),
(2), (4) Date: Oct. 4, 2012

(87) PCT Pub. No.: WO2011/079987
PCT Pub. Date: Jul. 7, 2011

(65) Prior Publication Data
US 2013/0056563 A1 Mar. 7, 2013

(30) Foreign Application Priority Data
Dec. 29, 2009 (DE) .......................... 10 2009 055 370

(51) Int. Cl.
*F02M 59/00* (2006.01)
*F02M 51/06* (2006.01)
*F02M 55/00* (2006.01)
*F16F 1/02* (2006.01)
*H01L 41/053* (2006.01)
*H01L 41/083* (2006.01)
*H01L 41/12* (2006.01)

(56) References Cited
(52) U.S. Cl.
CPC ........... *F02M 51/0603* (2013.01); *F02M 55/00* (2013.01); *F16F 1/028* (2013.01); *H01L 41/0536* (2013.01); *F02M 2200/26* (2013.01); *H01L 41/083* (2013.01); *H01L 41/12* (2013.01)

(58) Field of Classification Search
USPC ................................ 239/102.2, 533.8, 533.2
See application file for complete search history.

(56) References Cited

U.S. PATENT DOCUMENTS 6,499,471 B2 * 12/2002 Shen et al. .................... 123/498
2007/0096375 A1 * 5/2007 Stier et al. ..................... 267/167

FOREIGN PATENT DOCUMENTS

| CN | 1952380 | 4/2007 |
|---|---|---|
| CN | 101545433 | 9/2009 |
| CN | 101545431 | 5/2012 |

(Continued)

OTHER PUBLICATIONS

International Search Report, International Application No. PCT/EP2010/066790, dated Apr. 1, 2011.

*Primary Examiner* — Len Tran
*Assistant Examiner* — Adam J Rogers
(74) *Attorney, Agent, or Firm* — Kenyon & Kenyon LLP

(57) ABSTRACT

An injector for a fluid, particularly for fuel, is provided having a valve housing, a fluid intake, a valve chamber having a spray-discharge orifice, a piezoelectric or magnetostrictive actuator situated in the valve housing and a fluid-guiding pipe connecting a fluid intake and a valve chamber, which is situated in the valve housing running along the actuator. In order to create structural space in the valve housing for guiding through the fluid-guiding pipe which has a sufficiently large diameter for reducing pressure drops in the intake region, a hollow cylinder surrounding the actuator and developed as a prestressed spring is provided with a cylinder wall opening that extends axially through the entire length, and the positioning of the fluid-guiding pipe in the valve housing is undertaken so that it extends radially into the cylinder wall opening.

10 Claims, 3 Drawing Sheets

FOREIGN PATENT DOCUMENTS

| | | |
|---|---|---|
| DE | 10313599 | 10/2003 |
| DE | 10257895 | 6/2004 |
| DE | 10319599 | 11/2004 |
| DE | 102007028490 | 12/2008 |
| DE | 102008002010 | 12/2008 |
| EP | 1734253 | 12/2006 |
| JP | 2008300466 | 12/2008 |

\* cited by examiner

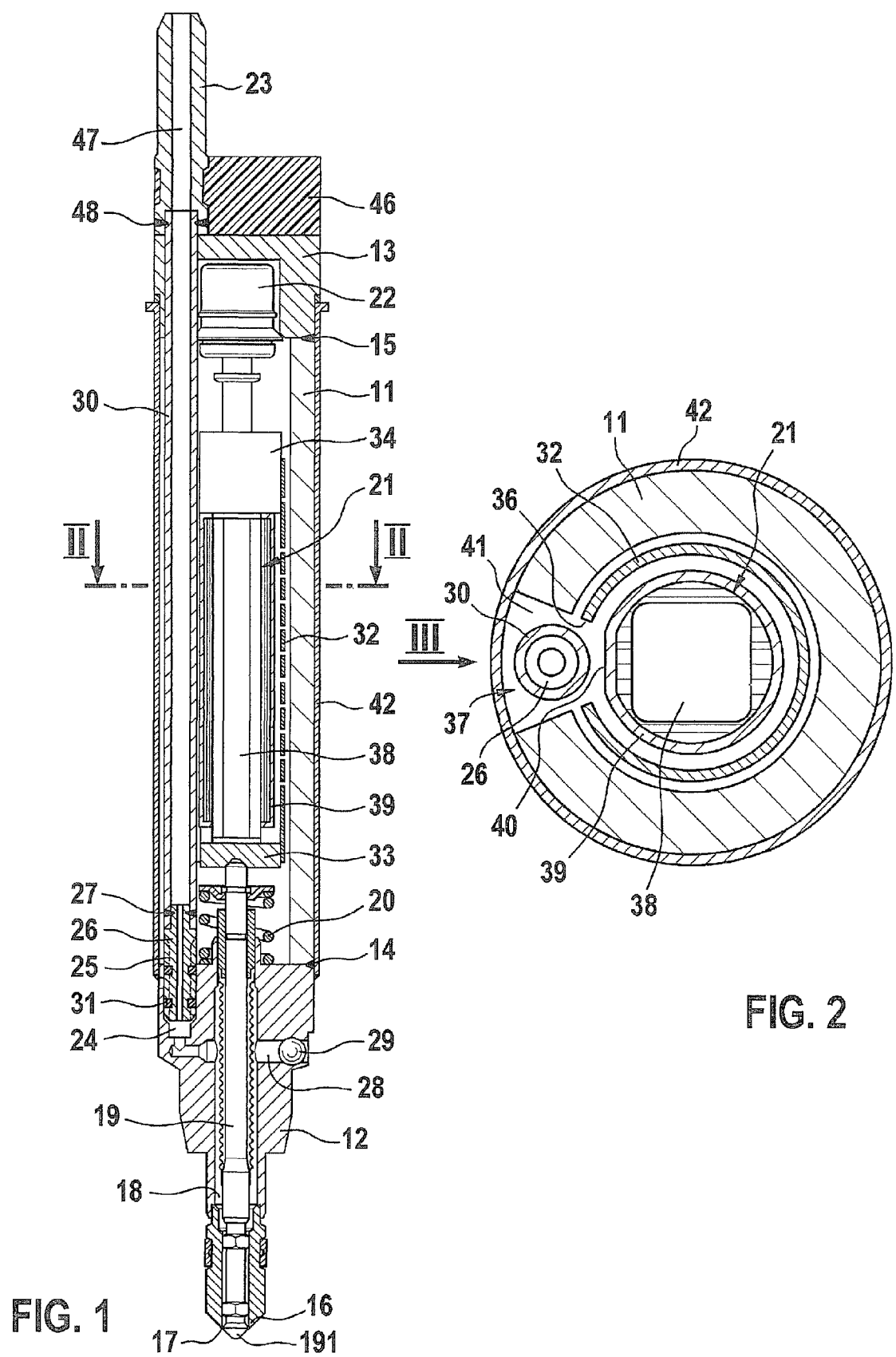

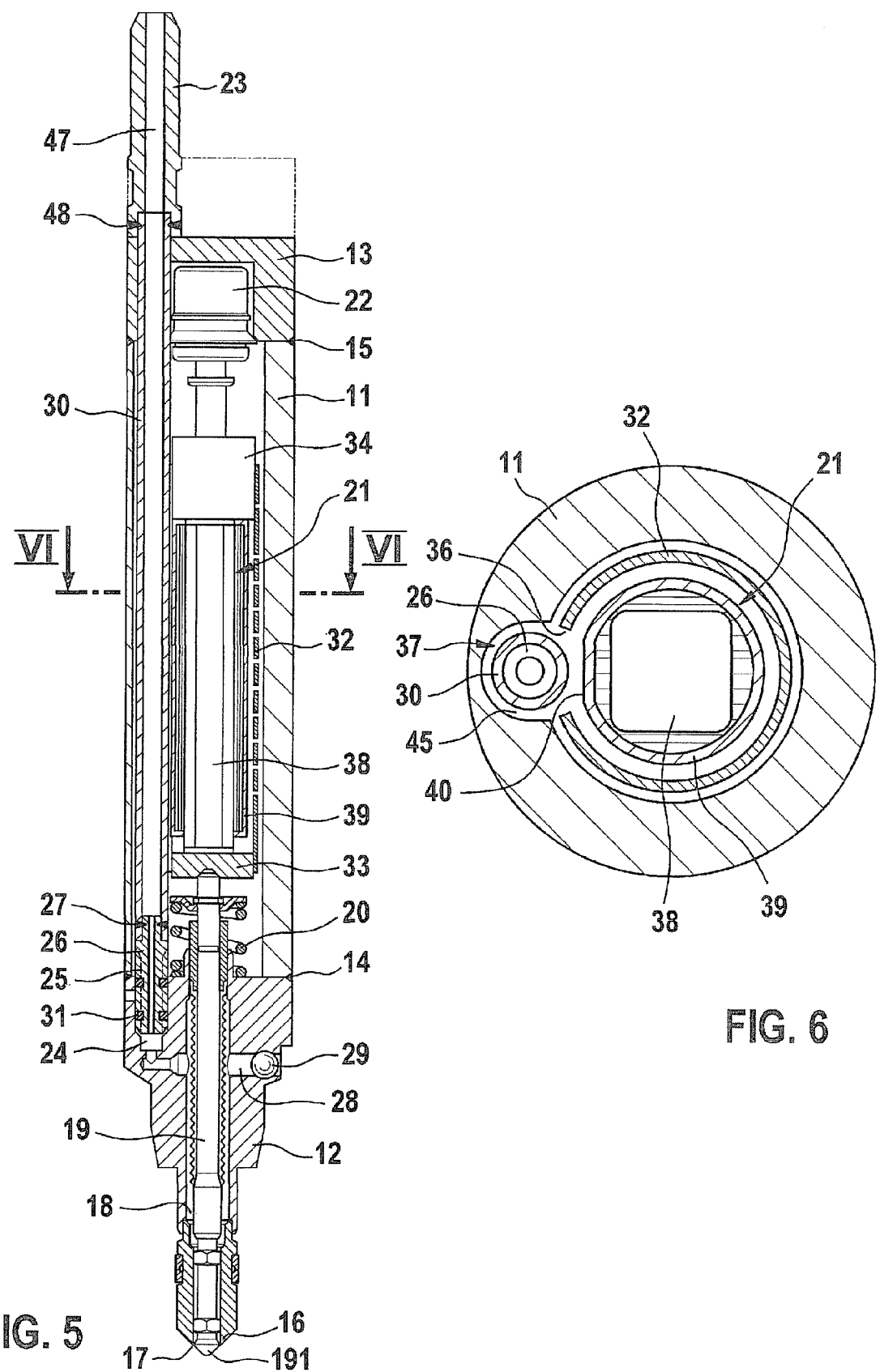

INJECTOR FOR A FLUID

FIELD OF THE INVENTION

The present invention relates to an injector for a fluid, in particular for fuel.

BACKGROUND INFORMATION

In a conventional fuel injector for internal combustion engines, described in, e.g., German Patent No. DE 102 57 895 A1, the pipe guiding the fluid, which connects the fluid supply to a valve chamber that is arranged in front of a valve seat in an inflowing nozzle body, is integrated into the valve housing and runs offset in a parallel manner to the housing axis. The valve housing encloses a circular-cylindrical cavity in which a piezoelectric or magnetostrictive actuator is disposed for actuating the valve. The housing wall, which has a circular ring-shaped cross-section, is radially thickened on one side throughout its whole length and is provided with an axial bore in the thickened region, in which the pipe is guided. At the lower end, the pipe is bent at approximately 90°, inserted in a radial opening in the nozzle body that opens out into the valve chamber and is welded or soldered to the nozzle body. At the end facing away from the nozzle body, the pipe is affixed to the intake nipple that forms the fluid supply and permanently connected to the intake nipple.

One conventional piezoelectric actuator for controlling a fuel injector, described in, e.g., German Patent No. DE 103 19 599 A1, is situated in a hollow cylinder developed as a bourdon tube and, with its end faces, lies against an upper and a lower cover plate. The two cover plates are each connected permanently to the hollow cylinder in a form-locking or force-locking manner, for instance, by welding, the hollow cylinder being axially prestressed before the welding. To achieve the spring property of the hollow cylinder, a plurality of equally developed, bone-shaped recesses are stamped into the cylinder wall of the hollow cylinder, which are positioned in a uniformly distributed manner and have the same internal cross sectional area. The actuator is supported with force locking on the two cover plates, and is loaded with pressure by these.

SUMMARY

An example injector according to the present invention may have the advantage that, because of the cylinder wall opening in the hollow cylinder, space is created for the insertion of the fluid-guiding pipe within the valve housing, between the housing wall and the actuator and, at the same time, a valve housing, that is suitable for production and is able to be produced as a simple turned body, may be used, whose internal diameter is only slightly larger than that of the hollow cylinder surrounding the actuator. The space created by the cylinder wall opening is sufficient for achieving a usable pipe diameter of the fluid-guiding pipe, using which, pressure drops in the supply region of the injector are still able to be held to acceptable limits.

According to one advantageous specific embodiment according to the present invention, to produce its spring property, the hollow cylinder has a plurality of recesses situated uniformly distributed over the cylinder wall, and is axially prestressed between two cover plates fastened to its end faces, whereby the actuator, lying at its end faces against the cover plates, is loaded compressively. The hollow cylinder, in this context, is produced as a stamped and bent part. The opening in the cylinder wall of the hollow cylinder, provided according to the present invention and going through the whole length, leads to an eccentric introduction of force, and with that, to a bending stress that damages the actuator. According to advantageous specific embodiments of the present invention, this is compensated for by alternative measures.

According to a first specific embodiment of the present invention, the hollow cylinder is situated, relative to the actuator, in such a way that the cylinder axis is displaced with respect to the actuator axis by a measure of eccentricity in the direction of the cylinder wall opening in the hollow cylinder. The measure of eccentricity is selected so that the pressure force exerted at the end face by the hollow cylinder on the actuator is introduced centrically on the axis of the actuator.

According to an alternative specific embodiment of the present invention, the hollow cylinder is situated coaxially with the actuator axis and the internal cross section of the recess in the region close to the cylinder wall of the hollow cylinder is less than the internal cross section of the remaining recesses. The sum of the smaller internal cross sections and the sum of the greater internal cross sections are matched to each other in such a way that the pressure force exerted on the actuator at the end face by the hollow cylinder is introduced centrically on the axis of the actuator.

According to one advantageous specific embodiment of the present invention, the actuator has a stack of piezoelectric or magnetostrictive ceramic elements and an actuator sleeve enclosing the stack, which is flattened in its region facing the cylinder wall opening in the hollow cylinder. Because of this flattening of the actuator sleeve, the structural space for guiding through the fluid-guiding pipe between the housing wall and the actuator is enlarged.

According to one advantageous specific embodiment of the present invention, an open channel, running through the whole length, runs in the housing wall of the valve housing, that lies radially opposite to the cylinder wall opening, into which the fluid-guiding pipe extends radially. Because of this constructive measure, the diameter of the pipe guided through between the housing wall and the actuator may be clearly enlarged, and the pressure drop in the intake region of the valve may be clearly reduced. For example, at an outer diameter of the valve housing of 20 mm, this enables the use of a pipe having a 4 mm outside diameter, which, at a wall thickness of ca. 0.8 mm, that is able to withstand the injection pressure, has an advantageously large flow cross section of ca. 3.8 mm$^2$.

According to one advantageous specific embodiment of the present invention, the channel in the housing wall may be implemented in various ways. In an advantageous manner, in this context, the channel is formed by a housing wall opening axially extending through the whole length, that is cut into the housing wall of the cylindrical valve housing and an outer pipe connected permanently to the valve housing, that is set around the housing wall. Alternatively, the channel may be formed by an axial groove running in the housing wall, preferably having a U-shaped groove cross section.

According to one advantageous specific embodiment of the present invention, the pipe guided through between the housing wall and the actuator in the valve housing, at its end faces is fixed coaxially at one end to an intake nipple and at the other end to a hollow cylindrical connecting piece, e.g., welded to the intake nipple and the connecting piece. In a tapped hole, in the form of a blind hole having an inner thread, which is introduced into a nozzle body containing the valve chamber, affixed at its end face to the valve housing, the connecting piece is screwed in. In the nozzle body, a fluid connection is produced between the tapped hole and the valve chamber. The tapped hole is hermetically sealed, using a.

sealing element situated in the area of the thread. Because of the threaded connection between the pipe and the nozzle body, and because of the sealing element situated in the tapped hole, the connection between the pipe and the nozzle body may be greatly loaded, and is resistant to the increasingly required high fuel pressures in the injector, at a reliable seal tightness.

BRIEF DESCRIPTION OF THE DRAWINGS

The present invention is explained in greater detail below on the basis of exemplary embodiments illustrated in the figures.

FIG. 1 shows a longitudinal section of an injector for a fluid.

FIG. 2 shows a section along line II-II in FIG. 1, shown enlarged.

FIG. 5 shows a longitudinal section of a modified injector according to an additional exemplary embodiment.

FIG. 6 shows a section along line VI-VI in FIG. 5, shown enlarged.

DETAILED DESCRIPTION OF EXAMPLE EMBODIMENTS

Figure 3:
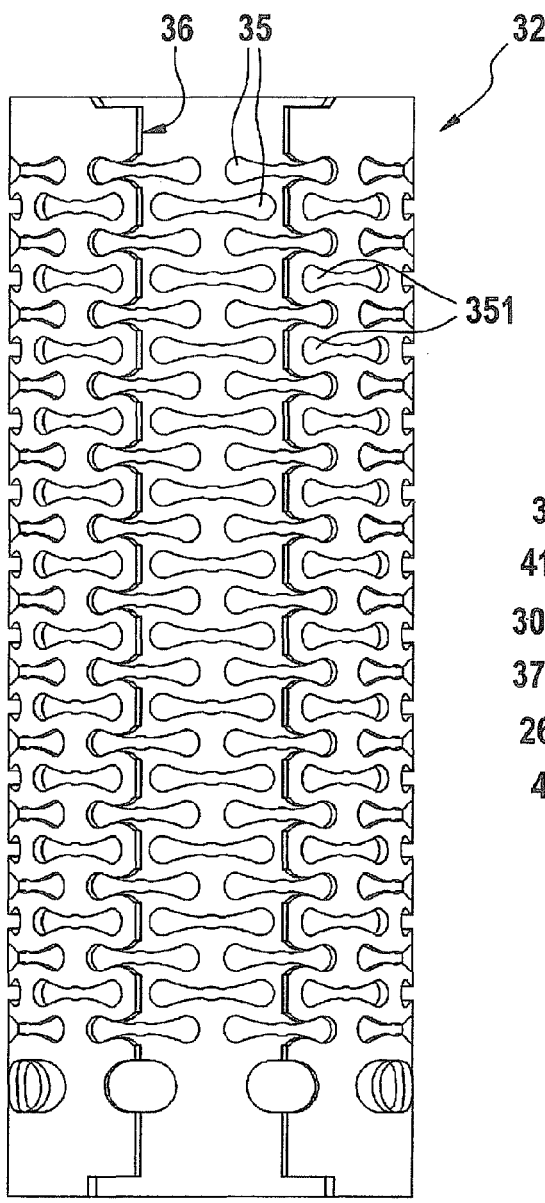
FIG. 3 shows a top view onto a hollow cylinder, forming a bourdon tube, in the injector according to FIG. 1 in the direction of arrow III in FIG. 2.

The injector, shown in FIG. 1 in longitudinal section, for a fluid such as fuel in a fuel supply system for internal combustion engines, has a pipe-like or sleeve-like valve housing 11, whose one housing end is closed by a nozzle body 12, and whose other housing end is covered by a connecting piece 13. Nozzle body 12 and connecting piece 13 are permanently connected to valve housing 11, e.g., by a circumferential welding seam 14, 15, respectively. A spray-discharge orifice 17 enclosed by a valve seat 16 is situated at the free end of nozzle body 12. A valve chamber 18 is disposed upstream from valve seat 16. A valve needle 19, which is guided inside nozzle body 12 in a displaceable manner, projects through valve chamber 18, the valve needle being pressed onto valve seat 16 via a closing head 191, by a valve closure spring 20 braced on nozzle body 12 and on valve needle 19, while spray-discharge orifice 17 is closed. A piezoelectric or magnetostrictive actuator 21 is provided to actuate valve needle 19 opening outwardly against the restoring force of valve closure spring 20, the actuator being accommodated in valve housing 11, in series with a hydraulic coupler 22, and clamped between valve needle 19 and connecting piece 13 in an axially force-locking manner. The design and function of coupler 22 are described in German Patent Application No DE 10 2007 028 490 A1, for example.

At the housing end of valve housing 11 covered by connecting piece 13 there is a fluid intake 47 in the form of an intake nipple 23 for slipping on a fuel supply line, intake nipple 23 being fixed by a plastic extrusion coating 46 of connecting piece 13. A pipe 30 guided through valve housing 11 establishes a pressure-resistant fluid connection between fluid intake 47 and valve chamber 18. Pipe 30, which is set at its one pipe end coaxially against intake nipple 23, and permanently connected to it (welding seam 48), is guided along actuator 21 and screwed into a blind hole 24 having an inner thread, which is inserted into nozzle body 12 radially offset to the housing axis of valve housing 11. Threaded connection 25 between pipe 30 and nozzle body 12 is produced, in this context, with the aid of a hollow cylindrical connecting piece 26, that has a thicker wall compared to pipe 30 and is welded or soldered to the pipe end (welding seam 27), and is provided with an outer thread which produces thread connection 25 with the inner thread in blind hole 24. Starting from blind hole 24, a fluid connection to valve chamber 18 is established beneath threaded connection 25. This fluid connection is implemented by a transverse bore 28, which opens out into blind hole 24, in this case, the base of the blind hole. Transverse bore 28 is radially introduced in nozzle body 12 and sealed in pressure-tight manner at the end remote from blind hole 24, by means of a press-fitted ball 29. At least one sealing element 31, which reliably prevents fluid leakage from blind hole 24 into the interior of valve housing 11 in which non-fuel-resistant actuator 21 is situated, is disposed in threaded connection 25.

Actuator 21, that is situated coaxially in valve housing 11, is accommodated in an hollow cylinder 32, that is also designated as a bourdon tube, which is fastened, for instance, welded at its end faces to a lower and upper cover plate 33 and 34, respectively. To achieve the spring property of hollow cylinder 32, its cylinder wall is provided with a plurality of recesses 35, that are situated distributed uniformly over the cylinder wall. As may be seen in FIG. 3, these recesses 35 have the shape of a bone, but may also have a different shape. Hollow cylinder 32 is axially prestressed between cover plates 33, 34, which has been undertaken before the welding of cover plates 33, 34 to hollow cylinder 32. Actuator 21, having a stack 38 made of piezoelectric or magnetostrictive ceramic elements that lie one on top of the other, lies with its end faces against the two cover plates 33, 34, via which hollow cylinder 32 exerts a pressure force upon actuator 21, so that stack 38 is axially pressure-loaded.

In order to create space for guiding pipe 30 through valve housing 11, along actuator 21, in the cylinder wall of hollow cylinder 32, an axial, broad-slotted cylinder wall opening 36 is present that extends throughout its length, into which pipe 30, that is situated in valve housing 11, extends radially (FIG. 2). In the exemplary embodiment of FIGS. 1 to 3, hollow cylinder 32 is situated coaxially with actuator 21. In order to avoid an eccentric introduction of the pressure force engaging at the end face of actuator 21, that is conditioned upon cylinder wall opening 36, as may be seen in FIG. 3, of those recesses 35 that lie in the area of hollow cylinder 32 close to the cylinder wall opening (designated as 351 in FIG. 3) are provided to have smaller cross sections than the remaining recesses 35. The sum of the cross sections of recesses 351 and the sum of the cross sections of remaining recesses 35 are matched to one another, in this instance, in such a way that the pressure force generated by hollow cylinder 32 and acting at the end face on actuator 21 is transmitted centrically onto actuator 21, that is, the force is introduced centrically into the axis of actuator 21.

In order to improve the space availability for guiding through a pipe 30 that is larger in diameter, and thereby further reducing the pressure drop in the intake region of the injector, on one side in the housing wall of valve housing 11 there runs a channel 37 that is radially opposite cylinder wall opening 36 in hollow cylinder 32, that is open towards cylinder wall opening 36 and runs through its whole length, and on the other side an actuator sleeve 39 that encloses stack 38 of actuator 21 is flattened at its region facing cylinder wall opening 36 in hollow cylinder 32. Pipe 30, having the greater diameter, now extends radially into channel 37, and all the way through cylinder wall opening 36 up to close to flattening 40 on actuator sleeve 39.

In the exemplary embodiment of FIGS. 1 and 2, channel 37 is formed by a housing wall opening 41 that is cut into the housing wall of valve housing 11 and axially extends over the whole length, and is formed by an outer pipe 42 that is set around the housing wall and permanently connected to valve housing 11.

The modified fuel injector, shown in FIGS. 5 and 6, differs from the previously described fuel injector only in that channel 37 in the housing wall of valve housing 11 is formed for guiding pipe 30 through valve housing 11 by an axial groove 45 running in the housing wall. Because of that, outer pipe 42 described before, for covering housing wall opening 41, may be omitted. Axial groove 45 preferably has a U-shaped groove cross section, whose rounding is adapted to the outer diameter of pipe 30.

Figure 4:
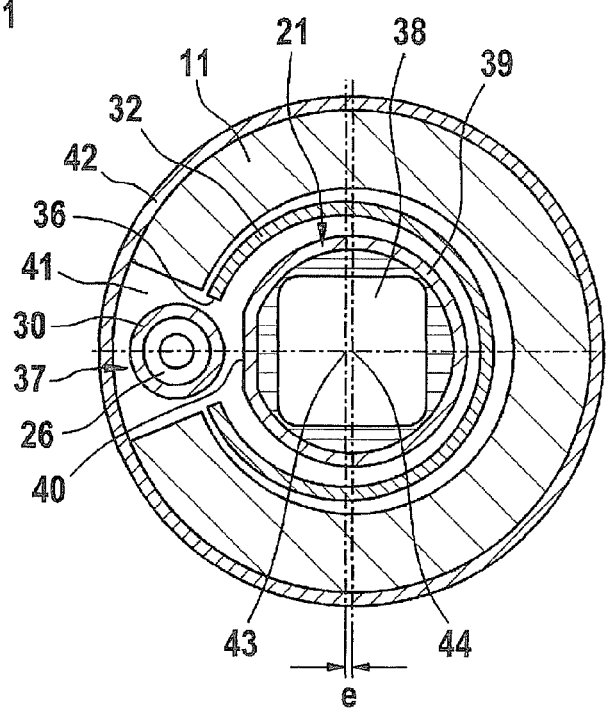
FIG. 4 shows a view, identical to FIG. 2, of a hollow cylinder situated in a modified manner.

In the case of a modification of the injector in FIG. 1 or FIG. 5 shown in FIG. 4, the hollow cylinder 32 representing a bourdon tube, for applying an axial pressure force on actuator 21, is also provided in its cylinder wall with a plurality of "bone-like" recesses 35, that are uniformly distributed over the cylinder wall, as were shown in FIG. 3. However, in contrast to FIG. 3, all recesses 35 are developed equally and have an identical internal cross section. In order to avoid the eccentric introduction of force triggered by cylinder wall opening 36 into actuator 21, in this case, hollow cylinder 32 is situated relative to actuator 21, lying coaxially with the housing axis, in such a way that cylinder axis 43 of hollow cylinder 32 is offset, compared to actuator axis 44 of actuator 21, by an eccentricity measure e in the direction of cylinder wall opening 36. Eccentricity measure e is dimensioned so that the pressure force generated by hollow cylinder 32 is transmitted centrically onto actuator 21, that is, it is introduced centrically into actuator axis 44.

Valve housing 11 may be a turned part, but is preferably produced as a punched and bent part, which is stamped and rolled after being punched.

In the injector shown in FIGS. 1 and 2, the punched and bent part, between whose mutually facing axial lining edges there remains housing wall opening 41, is set into outer pipe 42.

In the injector shown in FIGS. 5 and 6, after rolling, the mutually facing lining edges are welded together, so that an axial welding seam is created. The welding seam is preferably situated in the bottom of axial groove 45.

What is claimed is:

1. An injector for a fluid, comprising:
a valve housing;
a fluid intake;
a valve chamber having a spray-discharge orifice;
one of a piezoelectric or magnetostrictive actuator situated in the valve housing;
a fluid-guiding pipe connecting the fluid intake and the valve chamber, the fluid-guiding pipe being situated in the valve housing running along an actuator; and
a hollow cylinder surrounding the actuator, the hollow cylinder, as a prestressed spring, configured to generate a pressure force acting upon the actuator, the hollow cylinder having a cylinder wall opening running axially with respect to the longitudinal axis through a cylinder wall for a whole length of the cylinder wall, wherein the pipe is disposed in the valve housing so that the fluid-guiding pipe extends radially into the cylinder opening;
At least a portion of said fluid-guiding pipe being located within said cylinder wall opening.

2. The injector as recited in claim 1, wherein the hollow cylinder has a plurality of recesses distributed uniformly over the cylinder wall and is axially prestressed between two cover plates fastened at end faces of the hollow cylinder, at which the actuator is supported at the end faces of the actuator.

3. The injector as recited in claim 2, wherein the hollow cylinder is situated with respect to the actuator in such a way that a cylinder axis of the hollow cylinder is shifted with respect to an actuator axis of the actuator by an eccentricity measure in a direction of the cylinder wall opening, and the eccentricity measure is dimensioned so that the pressure force generated by the hollow cylinder is introduced centrically into the actuator axis of the actuator.

4. The injector as recited in claim 2, wherein the hollow cylinder is situated coaxially with the actuator, an internal cross section of some of the recesses in a region of the hollow cylinder that is close to the cylinder wall opening is less than an internal cross section of remaining recesses, and a sum of the internal cross sections of the smaller ones of the recesses and the sum of the cross sections of the remaining recesses are matched to each other in such a way that the axial pressure force generated by the hollow cylinder is introduced centrically onto the axis of the actuator.

5. The injector as recited in claim 2, wherein the actuator has a stack of one of piezoelectric or magnetostrictive ceramic elements, and an actuator sleeve, enclosing the stack, which is flattened in a region facing the cylinder wall opening.

6. The injector as recited in claim 1, wherein, in a housing wall of the valve housing, a channel is situated radially opposite to the cylinder wall opening and is open towards the cylinder wall opening, that goes through the whole length of the cylinder wall opening, into which the fluid-guiding pipe extends radially.

7. The injector as recited in claim 6, wherein the channel is formed by a housing wall opening, that is cut into the housing wall of the valve housing and extends axially through the whole length, and an outer pipe laid around the housing wall and connected permanently to the valve housing.

8. The injector as recited in claim 6, wherein the channel is formed by a groove running in the housing wall of the valve housing and has a U-shaped groove cross section.

9. The injector as recited in claim 1, wherein the fluid-guiding pipe at an end face of the fluid-guiding pipe is permanently fastened coaxially at one end to an intake nipple forming the fluid intake and at the other end, to a hollow cylindrical connecting piece, respectively, the connecting piece is screwed into a blind hole that has an inner thread in a nozzle body that includes the valve chamber and is fastened to the housing, and in the nozzle body a fluid connection is produced between the blind hole and the valve chamber, and the blind hole is sealed using at least one sealing element situated in a region of the thread.

10. The injector as recited in claim 1, wherein the valve housing is a stamped and rolled punched and bent part.

* * * * *